United States Patent
Dimond

(10) Patent No.: US 8,972,923 B2
(45) Date of Patent: Mar. 3, 2015

(54) METHOD AND APPARATUS AND SOFTWARE CODE FOR GENERATING A HARDWARE STREAM PROCESSOR DESIGN

(75) Inventor: Robert Gwilym Dimond, London (GB)

(73) Assignee: Maxeler Technologies Ltd., London (GB)

( * ) Notice: Subject to any disclaimer, the term of this patent is extended or adjusted under 35 U.S.C. 154(b) by 107 days.

(21) Appl. No.: 13/023,275

(22) Filed: Feb. 8, 2011

(65) Prior Publication Data

US 2012/0200315 A1 Aug. 9, 2012

(51) Int. Cl.
*G06F 17/50* (2006.01)

(52) U.S. Cl.
CPC .................................. *G06F 17/5054* (2013.01)
USPC ........... 716/136; 716/100; 716/102; 716/103; 716/106; 716/117; 716/132; 716/139

(58) Field of Classification Search
CPC . G06F 17/5054; G06F 9/445; G06F 11/3024; G06F 11/3027
USPC ......... 716/100, 102, 103, 106, 117, 132, 136, 716/139; 703/13, 14
See application file for complete search history.

(56) References Cited

U.S. PATENT DOCUMENTS

| | | | |
|---|---|---|---|
| 5,687,090 A * | 11/1997 | Chen et al. .......................... 703/6 |
| 6,086,629 A | 7/2000 | McGettigan et al. |
| 6,717,516 B2 * | 4/2004 | Bridgelall .................. 340/572.1 |
| 6,742,107 B2 * | 5/2004 | Jinzaki .......................... 712/200 |
| 6,751,783 B1 | 6/2004 | Eneboe et al. |
| 6,757,812 B1 * | 6/2004 | Green et al. ................... 712/222 |
| 7,039,834 B1 * | 5/2006 | Orfali ............................. 714/39 |
| 7,113,969 B1 * | 9/2006 | Green et al. ................... 708/495 |
| 7,139,901 B2 * | 11/2006 | Musoll et al. ................. 712/228 |
| 7,230,978 B2 * | 6/2007 | Bitterlich et al. ............. 375/219 |
| 7,305,649 B2 * | 12/2007 | Bellas et al. .................. 716/102 |
| 7,315,991 B1 | 1/2008 | Bennett |
| 7,359,846 B1 * | 4/2008 | Fernandez ...................... 703/13 |
| 7,603,492 B2 * | 10/2009 | Chai et al. ....................... 710/33 |
| 7,725,888 B2 * | 5/2010 | Yodaiken et al. ............. 717/163 |
| 7,817,655 B1 * | 10/2010 | Bennett et al. ................ 370/412 |
| 7,900,171 B2 * | 3/2011 | Van Dalen et al. ........... 716/100 |
| 8,068,541 B2 * | 11/2011 | Thomsen ....................... 375/240 |
| 8,074,177 B2 * | 12/2011 | Page et al. ..................... 715/763 |
| 8,078,980 B2 * | 12/2011 | Fuller et al. ................... 715/763 |

(Continued)

OTHER PUBLICATIONS

"Communication Synthesis in a Multiprocessor Environment", by Claudiu Zissulescu, Bart Kienhuis, Ed Deprettere published in Proceedings on the conference on Field Programmable Logic and Applications, 2005, in Tampere, Finland Aug. 24-26, 2006 (11 pages).

(Continued)

*Primary Examiner* — Helen Rossoshek
(74) *Attorney, Agent, or Firm* — Conley Rose, P.C.

(57) ABSTRACT

Embodiments of the invention provide a method of automatically generating a hardware stream processor design including plural processes and interconnect between the plural processes to provide data paths between the plural processes, the method comprising: providing an input designating processes to be performed by the stream processor; automatically optimizing parameters associated with the interconnect between processes within the design so as to minimise hardware requirements whilst providing the required functionality; and generating an optimized design in accordance with the optimization.

20 Claims, 7 Drawing Sheets

(56) References Cited

U.S. PATENT DOCUMENTS

| | | | |
|---|---|---|---|
| 8,135,853 B1* | 3/2012 | Khan et al. | 709/231 |
| 8,347,318 B2* | 1/2013 | Cho et al. | 719/320 |
| 8,464,190 B2* | 6/2013 | Bower et al. | 716/106 |
| 8,631,380 B2* | 1/2014 | Pell et al. | 716/132 |
| 8,689,156 B2* | 4/2014 | Huggett et al. | 716/110 |
| 8,701,069 B1* | 4/2014 | Dimond | 716/117 |
| 8,739,101 B1* | 5/2014 | Dimond | 716/116 |
| 2002/0159530 A1* | 10/2002 | Olson et al. | 375/240.29 |
| 2004/0022192 A1* | 2/2004 | Khan | 370/235 |
| 2004/0181387 A1* | 9/2004 | Petersen | 703/22 |
| 2006/0242617 A1 | 10/2006 | Bellas et al. | |
| 2008/0109828 A1* | 5/2008 | Cho et al. | 719/320 |
| 2008/0201498 A1* | 8/2008 | Ohkubo | 710/33 |
| 2011/0302231 A1* | 12/2011 | Huggett et al. | 708/208 |
| 2011/0320768 A1* | 12/2011 | Pell et al. | 712/30 |
| 2012/0216019 A1* | 8/2012 | Bower et al. | 712/201 |
| 2012/0330638 A1* | 12/2012 | Pell et al. | 703/21 |
| 2013/0046912 A1* | 2/2013 | Pell et al. | 710/305 |
| 2013/0091507 A1* | 4/2013 | Wu et al. | 718/104 |
| 2013/0145070 A1* | 6/2013 | Pell et al. | 710/305 |
| 2013/0173890 A1* | 7/2013 | Huggett et al. | 712/221 |
| 2013/0222399 A1* | 8/2013 | Bourd et al. | 345/506 |
| 2014/0013021 A1* | 1/2014 | Matsumoto et al. | 710/267 |
| 2014/0019729 A1* | 1/2014 | Pell et al. | 712/225 |
| 2014/0143744 A1* | 5/2014 | Dimond | 716/105 |

OTHER PUBLICATIONS

"Automatic Synthesis of Streaming C Applications to Process Networks in Hardware", by Sven van Haastregt and Bart Kienhuis, published in Proceedings Design Automation and Test in Europe, 2009 (4 pages).

Search Report for U.K. Application No. GB1201721.6, dated Jun. 1, 2012 (4 pgs).

Chen et al., "LOPASS: A Low-Power Synthesis System for FPGAs With Interconnect Estimation and Optimization" IEEE, Transactions on a Very Large Scale Integration, (VLSI) Systems, vol. 18, No. 4, pp. 564-577, Apr. 6, 2010 (14 pgs).

Lin et al., "Exploring FPGA Routing Architecture Stochastically", IEEE, Transactions on Computer-Aided Design of Integrated Circuits and Systems, vol. 29, No. 10, pp. 1509-1522, Oct. 2010 (14 pgs).

He et al., "Optimal Buffering of FPGA Interconnect for Expected Delay Optimization", IEEEE, Field-Programmable Technology, ICFPT 2007 (4 pgs).

* cited by examiner

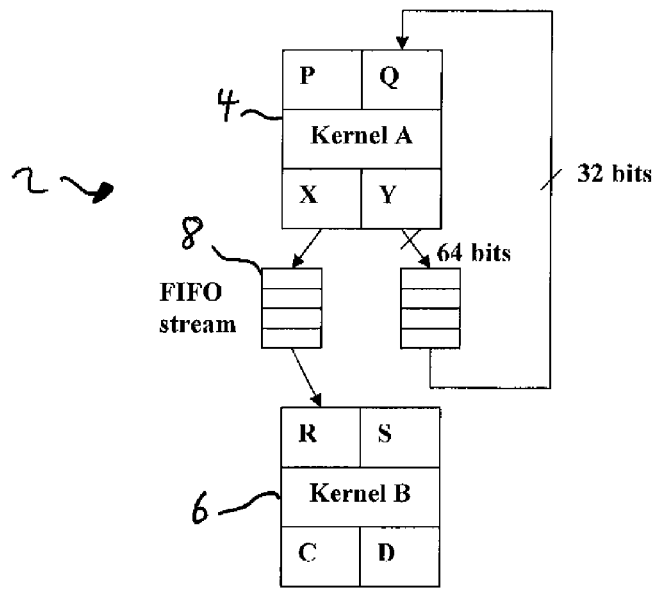
Figure 1 - Example hardware design with two kernels (A and B). Kernel A has two input (P,Q) and two output (X,Y) ports.
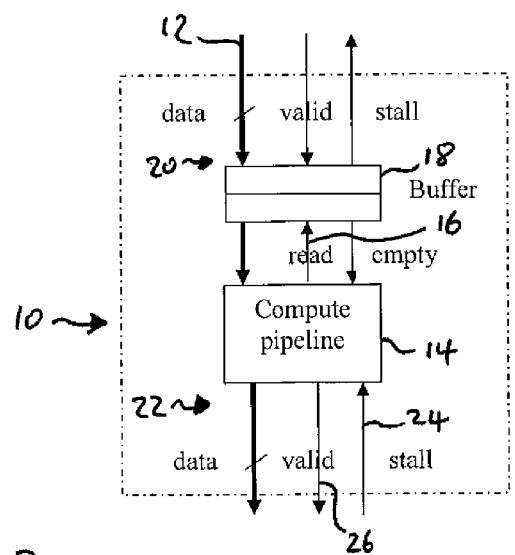
Fig. 2

METHOD AND APPARATUS AND SOFTWARE CODE FOR GENERATING A HARDWARE STREAM PROCESSOR DESIGN

STATEMENT REGARDING FEDERALLY SPONSORED RESEARCH OR DEVELOPMENT

Not applicable.

BACKGROUND OF THE INVENTION

1. Field of Invention

The invention relates to a method and apparatus for generating a hardware stream processor design. In embodiments, the invention also includes a method for the optimization of hardware implementations for streaming data transfer between interconnected processes.

2. Background of Technology

In certain embodiments, the invention relates to computing using hardware processes communicating using unidirectional FIFO (first in, first out) data streams. Each hardware process has zero or more input/output ports that sink/source data. FIFO data streams connect between the input port of one process and the output port of another process (which could be the same process). Optionally, FIFO streams may also connect to I/O devices (input/output devices), for example a processor bus for interaction with software or a memory device.

Typically, hardware processes such as may be provided by a Field Programmable Gate Array (FPGA) run asynchronously and in parallel, reading data items from the process inputs and producing data at the process outputs. The FPGA might typically form part of an accelerator for use with a host computer, in which the FPGA is arranged to be configured by the customer or designer after manufacture, so as to perform its designated tasks and processes.

Similar networks of communicating processes, e.g. on an FPGA, are known in the literature as Kahn Process Networks (KPN). KPNs provide a distributed model of computation in which a group of deterministic sequential processes communicate through unbounded FIFO channels. A method and apparatus is required for implementing process networks in hardware such as FPGAs or other programmable logic devices, for high-performance computing.

It is known that FPGAs have limited resources, typically comprising Look Up Tables (LUTs) and FlipFlops, both of which are used for compute operations, and Block Random Access Memory (BRAM), used for buffering. FPGAs also provide reconfigurable interconnects that allow the limited to be connected together so as to provide, overall, a desired function or process on data passing through. By minimising hardware requirements or maximising efficiency of resource utilisation for the interconnect to implement FIFO streams between processes within a given process or network of processes, significant benefits can be achieved. The benefit of optimization is that more resources are available for compute, which translates to higher performance. FPGA configuration is generally specified using a hardware description language (HDL), and it is known that such devices can be used to implement any logical function that an ASIC could perform.

Typically, processes within an FPGA, are often pipelined hardware data-paths that compute a complex operation, for example, a multi-dimensional convolution. These processes are referred to herein as 'kernels'. In other words, a kernel is a synchronous, pipelined data-path that produces/consumes data according to an application specific pattern at a particular clock rate. For example, a convolution kernel may run at 100 MHz and consume 2×32-bit input data points and produce 1×32-bit output data point every cycle (10 ns).

EIn addition to (or instead of) data-paths or computation, kernels also may perform elementary control of data flow. Two common examples are multiplex and de-multiplex kernels (Mux and Demux, respectively). A mux has multiple input ports and a single output port and connects a single run-time selectable input port to the output port. A demux has a single input port and multiple output ports and connects a single run-time selectable output port to the input port.

BRIEF SUMMARY OF THE PREFERRED EMBODIMENTS

FIG. 1 shows a schematic representation of a network 2 comprising two kernels 4 and 6, labelled "Kernel A" and "Kernel B". Kernel A 4 has two input ports, P and Q, and two output ports X and Y. A FIFO buffer 8 is arranged to receive data from each of the output ports X and Y of Kernel A to provide storage prior to the forward routing of the data to its destination. In this case, data output from port X is routed to input port R of Kernel B 6 and data output from port Y of Kernel A is routed back to input port Q of Kernel A. In the example shown, the output ports X and Y are considered the data sources, as they are, in the most general sense, the source of the data being forwarded from the Kernel A 4 through the network. The input ports Q (of kernel A 4) and R (of Kernel B 6) are considered the data sinks, as they are, in the most general sense, the sinks for data received from the sources X and Y, respectively.

It will be appreciated and as will be explained below, that there are numerous variables associated with each of the kernels within such a network. For example, some means of flow control is required so as to ensure that data is not lost between kernels due to insufficient storage at a port or in the FIFO buffer or that unnecessary delay does not arise due to waiting too long so as to be sure that data is not lost. To achieve this, in hardware such as an FPGA or other programmable logic, the data streams typically include both the data itself and flow control signals for the purpose of arbitrating transfer of data between nodes or ports on the network. Three well known flow control schemes that are typically used are:
1. EMPTY/READ.
2. VALID/STALL; and,
3. SOURCE READY/SINK READY.

In an EMPTY/READ flow control scheme, two flow control signals, EMPTY and READ are used. When a data source has data available for reading, the EMPTY signal output from the data source is deasserted. The connected data sink then asserts the READ signal to transfer an item of data.

In a VALID/STALL flow control scheme, again two flow control signals are used, this time VALID and STALL. The STALL signal output is deasserted by the data sink to indicate that it is ready to receive data. The data source then asserts VALID to transfer data to the sink.

Last, SOURCE READY/SINK READY flow control scheme uses the flow control signals SOURCE READY/ SINK READY. Data is transferred from the source to the sink on any cycle where both SOURCE READY and SINK READY are asserted.

Conventionally, a hardware designer typically chooses a particular flow-control scheme for use within a hardware design and all kernels used in the design are designed or adapted to that scheme. In some cases, this can lead to a lack of optimization since in dependence on the type of process a kernel is executing, one or other flow control scheme may work better.

Indeed, it is typical that in the design of systems with interconnected processes, designers typically standardise on a mechanism of flow-control to dynamically manage the flow of data within the system. Flow control ensures that data is transferred only when the connected source and sink processes are both ready to transfer data. Without flow control, data is lost due to being sent when the sink is not ready (overflow) or corrupted due to being received when the source is not ready (underflow).

A problem with standardising on a single flow control mechanism is that for different processes, different types of flow control mechanism are more or less efficient to implement and the most optimal design may contain multiple different types of flow control. For example, a computation pipeline naturally has a PULL type interface at the input and a PUSH type interface on the output. This is so as to be able easily to see if an input buffer is empty, and if not transfer data on request and to see if an output buffer is not full, and push data into the buffer on request. It is always possible to convert between different flow control types using buffering or logic but there is a consequential hardware cost. Any hardware used for such a purpose cannot then be used for the main processing function of the FPGA.

FIG. 2 is a schematic representation of a compute pipeline 10 using a simple external flow-control scheme for input and output data. The flow-control scheme consists of 1-bit VALID and STALL signals. Data 12 flows through the pipeline 10 and is processed in accordance with the compute logic 14 logic within the pipeline 10.

Internally the pipeline control logic needs to check if data items are available and then control transfer of data using a read signal 16. A buffer 18 is inserted to maintain the same flow-control scheme on both input 20 and output 22 data interfaces. In other words, by inserting a buffer 18, the flow control scheme used for data entering and leaving the pipeline 10 as a whole, can all be set at VALID/STALL. However, the buffer 18 is wasteful if the data source for the compute pipeline (for example a FIFO or SRAM interface) natively supports the READ/EMPTY semantics of the compute pipeline 10.

Requirements to insert buffering/logic also arise because of pipelining of control logic to maximise clock frequency and throughput. Increasing the latency of the signal allows insertion of pipeline registers between the logic that generates the signal (STALL) and the logic that interprets the signal. As is well known, such pipeline registers increase the effective maximum clock rate of the design by reducing the amount of logic/routing delay within a single clock period. For example, the compute pipeline in FIG. 2 may have some latency between STALL 24 being asserted on the output and VALID 26 being deasserted. If the flow-control requires immediate deassertion of VALID, another (possibly redundant) buffer (not shown) must be inserted.

Manually optimizing the flow control, i.e. choosing a different scheme at every point in the design, is time consuming, error prone and prohibits efficient reuse of logic blocks. Each block must be optimized for each and every circumstance that it is used and separate versions maintained.

Another issue that arises in the design of logic for an FPGA relates to the fact that different kernels may run at different clock rates and/or with different data widths. Indeed, multiple kernels in a design may run at different clock rates. To address this logic may be inserted to transition data cleanly between the clock domains and thus avoid corruption of data. Kernel input/output ports may be connected that have different aspects (bit-widths). To address this, logic may be inserted to buffer/shift the data and thus manage transition between ports that produce/accept a different number of bits per cycle.

FIG. 3 shows a schematic representation of a network 28 including two Kernels 30 and 32, A and B. The two Kernels 30 and 32 are running on their own independent clocks 34 and 36, respectively. Data transfer is required from Kernel A 30 running on clock A 34 and Kernel B 32 running on clock B 36. To achieve this, cross-clock logic 38 is provided that enables the cross-clock transition to be made. Cross clock logic is required to transfer data between different clock domains in digital logic circuits. A non-limiting example of cross clock logic is a FIFO buffer with separate read and write clocks, where a gray-coded counter is used to synchronize the FIFO state across the clock domains.

Where different data widths are used in different kernels similar issues of compatibility and connectibility arise. Certain blocks or kernels, may not be fixed to a particular clock or bit-width. For example mux/demuxes for routing, ports to I/O devices such as the host or memory. A mux may have two inputs with a width of 32-bits and two inputs with a width of 64-bits. Similarly, two inputs may be in clock domain A and two in clock domain B. To minimize resource usage, it is desired to pick an optimal bitwidth and clock frequency for the mux itself to minimize the transitions between clock domains and packing/unpacking between different widths as shown schematically in FIG. 4. Selecting clock domains and bit widths is an optimization problem.

In the example of FIG. 4, a simple 2-kernel process network is shown. The network comprises Kernels A and B 40 and 42. Kernel A 40 is arranged so as to generate 4×8-bit items 43 per cycle on output port X 44. Kernel B 42 is arranged to receive 1×8-bit items 45 per cycle on input port Q 46. Data transfer is required from Kernel A producing to Kernel B and some means for converting the data width accordingly is required. To achieve this aspect change logic 48 is provided "between" ports X 44 and Q 46.

Another issue that arises in the design of logic for an FPGA relates to the fact that certain data flows can be prone to causing deadlock unless specific provision is made for them. Indeed, some kernels may require buffering on inputs/outputs to handle patterns of data-flow that would otherwise cause deadlock. In the example of FIG. 5, the pattern of Kernel A writing to outputs X and Y, together with the pattern of Kernel B reading from R means that buffering must be inserted. When Kernel A runs, it first writes data to X but Kernel B cannot run until it has data on both X and Y of Kernel A. Accordingly, buffering is required to store data on X until data becomes available on Y, at which point Kernel B can start to read.

Conventionally, a designer manually inserts buffering with knowledge of the entire design. However, this approach requires knowledge of all kernels in the design and how they behave and is thus error-prone and complex.

An alternative would be simply to insert buffers at the input/outputs of each and every kernel in a network. However, this is wasteful of resources since buffering may already be available in other connected kernels or buffering may be inherent in the interconnect. For example, FIFO buffers are often used to cross data between different clocks and that same buffering could in theory be used to prevent deadlocks.

Another issue that arises in the design of logic for an FPGA relates to the fact that flow control signals used to manage data-flow between kernels may have a latency after which they are valid, as discussed above. A common case is that, for a single kernel, these latencies are interdependent. Interdependent flow control latencies means that the latency of a particular flow control signal for a set of input/output ports (e.g. stall) has a latency=f(N,K) relationship where K is a constant specific to a particular input/output, N is a variable that applies to all input/output ports in the set and f( ) is a mathematical function. A common case is for f( ) to be an addition function and for input ports to have an N+0 latency and output ports to have an N+1 latency.

FIG. 6 shows a simple example of a mux kernel that selects data from two input streams or sources (A or B (not shown)). There are three sets 66, 68 and 70 of flow control and data signals that are used, corresponding to the two input channels (A and B) and the output from the mux. In addition, a select signal 62 is used to identify from which stream, A or B, data is to be taken from the mux. For each of the input streams and the output signals, there is used a STALL signal, a VALID signal and a DATA signal. STALL/VALID flow control is used such that for each of the sets of signals 66, 68 and 70, the STALL signal output is deasserted by the associated data sink to indicate that it is ready to receive data. The data source then asserts VALID to transfer data to the associated data sink. The data out signal 60 is taken from the second mux component 54 and from there provided to a sink 64.

The mux 50 is pipelined, thereby causing an additional cycle of latency between the signals stall_out and valid_out. The mux 50 is, in effect made up of two mux components 52 and 54. The first mux component 52 serves to provide flow control whereas the second 54 serves to multiplex the data itself. Two data channels or sources 56 and 58 are arranged to provide data as inputs to the second mux component 54. By appropriate control with the select signal 62, a single data out signal 60 is provided as the data output from the device. Flow control within the device is used to ensure correct operation but due to differences between latencies of the various control signals and devices, problems can arise.

In this simple example, the latency between stall_out asserting and valid_out deasserting is equal to the latency of stall A asserting to valid A deasserting plus one cycle. To illustrate this latency, consider the case where source A is transferring data continuously to the sink, by asserting valid_A for multiple successive cycles. The select signal is set to 'A', so valid_out is equal to valid_A delayed by one cycle and thus is also asserted for multiple successive cycles. Now, the sink determines that it can no longer accept data (for example, due to a lack of remaining buffer space) and asserts stall_out. Stall out is connected to stall A, so source A will deassert valid_A after N cycles, where N is the stall latency of A. Since valid_out is valid_A delayed by 1 cycle, the sink 'sees' valid_out deassert N+1 cycles after asserting stall_out.

Conventionally, the interfaces on both the input and output sides of the mux could be fixed and therefore the latency between stall and valid could be addressed. For example, the input latency could be set to 1 and the output latency to 2, or any numbers that fit the N+1 rule. Buffering would be inserted after the mux to maintain that fixed latency. The problem with such conventional solutions is that this buffering is wasteful of hardware in cases where many kernels are interconnected.

Using advanced manual design it is possible to schedule the latencies to minimize the total amount of buffering. However, advanced manual design of this nature is time consuming and error prone. FIG. 7 shows a simple example of a design with three cascaded mux kernels. In this example, latencies are scheduled to minimize buffering. The design on the left has a fixed latency (L=1) for every interface and so buffers are required to convert the latency to one at every stage. In other words, data that has passed through the first two muxes 57 and 59 has an accumulated latency of L=2, as it has a starting latency of L=1 at the mux inputs and the logic within the mux (see FIG. 6) adds an additional cycle of latency. The buffers 61 serve to convert the latency to one prior to the mux 63. This is repeated down the chain.

The design on the right schedules the latency of the mux kernels so that only one buffer is required to convert from L=3 to L=1. The scheduling allows the downstream mux 63 to accumulate an additional cycle of latency so that buffers 61 are no longer required.

Thus, it can be appreciated that there are a number of issues that arise in the generating and designing of a data processor including optimization for hardware implementation for streaming data transfer between interconnected processes.

U.S. Pat. No. 7,315,991 discloses a method of creating a circuit from a high level programming language (HLL) program. The method includes generating a netlist from the HLL program, wherein the netlist, being a software-based circuit representation or a hardware description of a circuit, specifies the circuit design. The circuit design can be run within a programmable logic device and a plurality of execution threads can be identified at runtime to determine scheduling information.

The article entitled "Communication Synthesis in a Multiprocessor Environment", by Claudia Zissulescu, Bart Kienhuis, Ed Deprettere published in Proceedings on the conference on Field Programmable Logic and Applications, 2005, in Tampere, Finland 24$^{th}$ to 26$^{th}$ Aug. 2006, discloses a design methodology for fast mapping of nested-loop applications, such as Digital Signaling Processing, Imaging or Multi-Media, written in a subset of Matlab onto reconfigurable devices. The methodology generates a process network in which interprocess communication takes place in a point-to-point fashion. Four types of point-to-point communication are identified. Two use a FIFO-like communication and the other two use a cache like memory to exchange data. The disclosed methodology can be realised automatically and efficiently in FPGAs.

The article entitled "Automatic Synthesis of Streaming C Applications to Process Networks in Hardware", by Svan van Haastregt and Bart Kienhuis, published in Proceedings Design Automation and Test in Europe, 2009 discloses a method of automatic generation of hardware implementations on FPGAs from a single sequential C input specification of a streaming application. A high level synthesis tool is used.

The entire contents of all of the three mentioned documents is hereby incorporated by reference.

According to a first aspect of embodiments of the invention, there is provided a method of automatically generating a hardware stream processor design including plural processes and interconnect between the plural processes to provide data paths between the plural processes, the method comprising: providing an input designating processes to be performed by the stream processor; automatically optimizing parameters associated with the interconnect between processes within the design so as to minimise hardware requirements whilst providing the required functionality; and generating an optimized parameterised design in accordance with the optimization.

The method provides a way in which the design of a programmable logic device can be generated whilst addressing the issues identified above. In particular, by providing for the automatic optimization of parameters within the system, a correspondingly optimized design can be automatically generated. The risk of operator error is avoided whilst simultaneously enabling the use of non-process related resources to be minimised or avoided.

The parameters that are optimized can be any one or more of various parameters associated with the programmable logic device. For example, the parameters may relate to flow control of the design or indeed other aspects such as data width or clock rates within the design of the stream processor. It will be appreciated that all of the problems identified above are addressed by the provision of a method in which parameters within a design are automatically optimized so as to minimise hardware requirements whilst providing the required functionality.

For example, the automatic optimization enables the flow control methodology to be assigned for each process on a process-by-process basis without requiring an operator manually to review each situation and determine which flow control methodology to implement. Furthermore, the problem of different clock rates and data widths between processes can automatically be addressed in such a way that resources within the design are efficiently used.

In embodiments, the parameterisation may include determination of one or more of:
Type of interface (PUSH vs PULL)
Width of interface
Clock rate of interface
Latency of flow control signals (e.g. stall/empty)

As described herein, methods are provided by which any one or more of these parameters may be optimised automatically so as to minimise hardware requirements for interconnects between processes whilst still providing the required functionality. By minimising the hardware requirements for the interconnect a greater proportion of the logic of a device of a given size remains for processes themselves thus enabling increased performance to be achieved from the same amount of logic.

In one example, the method comprises automatically determining flow control methodologies between processes in the design.

Within a stream processor different processes typically operate using different flow control methodologies. By automatically determining the flow control methodologies between processes, it is possible to optimize the usage of resources within the processor such that the amount of processor resource that will the need to be dedicated to non-process related function can be minimised.

In one example, the method comprises scheduling stall latencies between the processes by using defined parameters.

The use of a defined parameter for the scheduling of stall latencies within the processor has significant advantages. In particular, by using a variable or parameter to define the latency of a port or process in the processor and then defining later latencies with respect to the parameter, the latencies within the system as a whole or a connected part of it can easily and efficiently be modeled or assigned.

In one example, the method comprises, in the event that the flow control methodologies between processes in the design are all of one specified type, defining a parameter to represent the stall latency in a cascade of connected processes and determining a value for the parameter so as to minimise storage requirements.

In one example, in which each of the processes has one or more output ports connected to one or more input ports of a connected process and a corresponding clock rate, the method comprises optimizing the clock rates for connected ports.

In one example, in which each of the processes has one or more output ports connected to one or more input ports of a connected process and a corresponding data width, the method comprises automatically optimizing data widths for connected pairs of ports.

In one example, in which the input design is in the form of an acyclic graph in which processes are vertices of the graph and data streams between processes are arcs between the vertices, the method comprises performing the automatic optimization for a subtree of the graph and, preferably, once complete, for subsequent subtrees of the graph until the entire graph has been optimized.

Any suitable way or means can be used to determine optimum values for the data widths and clock rates of each process. One preferred way uses combinatorial optimization.

This can be achieved by determining the cost for each configuration of values within a process node, and assigning to the node values that provide the minimum overall cost for the process. The cost is defined as the amount of hardware resources that need to be dedicated to the glue logic or non-process related hardware to enable a particular configuration to be implemented.

In one example, the method comprises, determining cost for transfer from one process to another, the overall cost being made up of the sum of cost for a configuration of values within a process and the cost for transfer from one process to another. Thus, an objective, consistent, efficient and reliable method is provided by which optimum values can be ascertained for parameters, i.e. data width and clock rate, of a process.

In one example, the method comprises, once the overall cost for a subtree has been determined, performing the optimization for subsequent subtrees of the graph until the entire graph has been optimized.

Thus, a method is provided by which an entire process network can be configured automatically to optimize performance and resource utilisation.

In one example, the method comprises, comprising automatically providing aspect conversion logic in the design once optimization has been performed.

Thus, once a first set of optimizations have been taken into account, e.g. the parameterisation of flow control latencies or the clock rates and/or data widths, aspect conversion logic can be added to the design. This therefore minimises the use of such aspect conversion logic since it is only added once other optimizations or configurations have been made to the design.

In one example, the method comprises, automatically providing adaptor logic in the design once optimization has been performed.

Thus, again, as with the use of aspect conversion logic, once a first set of optimizations have been taken into account, adaptor logic can be added to the design. This again minimises the use of such logic since it is only added once other optimizations or configurations have been made to the design.

In one example, the method comprises automatically inserting FIFOs into the design once optimization has been performed.

In one example, the method comprises optimizing clock rates and data widths after each optimization step.

In one example, FIFOs are only inserted between any pair of processes if one or more conditions are satisfied, the conditions, including: a) the source clock rate and the sink clock rate are not the same; and b) the source flow control methodology and the flow control methodology are not the same. Various other conditions may be taken into account as shown, for example, in FIG. 13. This method ensures that the amount of FIFOs added is maintained at a minimum.

According to a second aspect of embodiments of the invention, there is provided a method of making a programmable logic device, the method comprising: generating a design using the method of the first aspect of the invention; and programming the logic device to embody the generated design.

According to a third aspect of embodiments of the invention, there is provided a computer program arranged, when run on a computer to execute the steps of the first aspect of the invention.

Preferably, the computer program is stored on a computer-readable medium. The computer readable medium can be any appropriate sort of medium. For example, it can be a disc or the like or indeed a transmittable medium such as a signal. For example it can be of any transmissible sort including being provided over the internet or the like.

According to a fourth aspect of embodiments of the invention, there is provided a Field Programmable Gate Array or other programmable logic, having a design generated using method of the first aspect of the invention.

An FPGA or other programmable logic device formed to have a design determined according to the first aspect of the present will provide optimum performance since unnecessary memory or hardware usage will be minimised and/or avoided entirely. Furthermore, it will have been created quickly and efficiently in a manner that is not prone to error in the way that a design generated by a user manually considering the optimization of each component would encounter.

According to a fifth aspect of embodiments of the invention, there is provided a system for generating a hardware stream processor design, the system comprising: a processor arranged to execute the method of the first aspect of the invention and to generate a list of instructions for the programming of a programmable logic device having the generated design.

A system is provided that enables a user to generate the required list of instructions, such as a netlist, to enable the formation of an optimized FPGA, in which memory and logic requirements for non-process related tasks are minimised or avoided.

According to a further aspect of embodiments of the invention, there is provided a method of generating a design for an FPGA processor comprising plural interconnected processes, the method comprising upon receipt of a specified input design, optimizing the parameterisation of input/output interfaces of processes within the design, and once this has been done, optimizing the interconnections between each of the optimized processes. This enables performance levels to be maintained with minimal resource utilisation., In other words, in contrast to conventional schemes, in which, with reference to flow control methodologies, a designer typically chooses on a particular flow-control scheme and all kernels or processes are then adapted for use with that flow-control scheme, in the present method, an optimal flow control scheme for each kernel is selected and then cross-optimization between the kernels is performed. In other words, a "space" of parameterised schemes is supported and a point, optimal for each individual kernel, is selected from within the space prior to cross-optimization between the kernels.

According to a further aspect of embodiments of the invention, there is provided a method of automatically generating an optimized programmable logic design for a streaming processor, the programmable logic design including process kernels and interconnects, the method comprising parameterising the kernel interconnects during an programmable logic design process and optimizing the parameters to generate an optimized programmable logic design.

Throughout the above, references to examples, it will be appreciated that any one or more of the features can be provided in combination with any other, as required.

BRIEF DESCRIPTION OF DRAWINGS

Embodiments of the invention will now be described in detail with reference to the accompanying drawings, in which:

FIG. 1 is a schematic representation of a part of a hardware processor including two kernels (A and B);

FIG. 2 is a schematic representation of a compute pipe-line using an external flow-control scheme;

DETAILED DESCRIPTION

Figure 3:
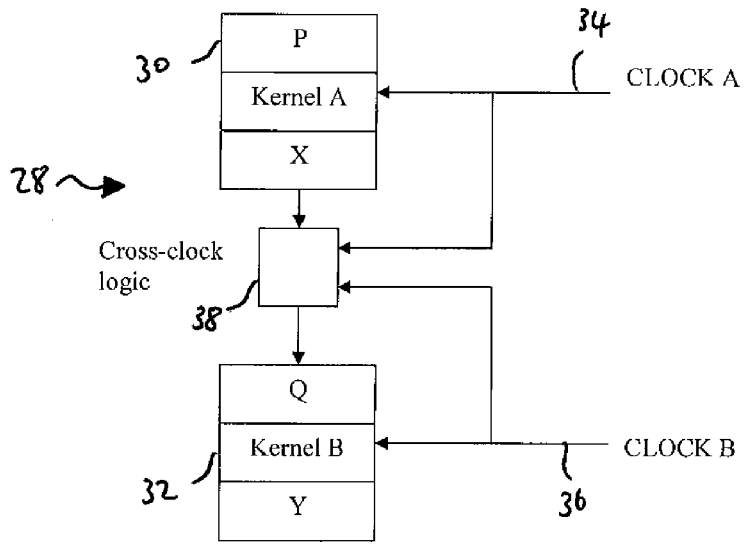
FIG. 3 is a schematic representation of 2 kernels (A and B) utilising cross-clock logic.

Before describing in detail an example of how the present method and apparatus operates, some general aspects of the system will be described.

There is provided, the parameterisation of interface 'ports' on streaming processors and a method of connecting parameterised ports to ensure correct flow control and to prevent deadlock. By this parameterisation, there is provided a systematic method for describing the interfaces between FIFO ports on kernels or input/output devices so that certain conditions are satisfied. First, the system ensures that any kernel port can be connected to any other kernel port, with any interfacing logic automatically being generated. Second, an automatic compiler automatically optimizes the interconnect to reduce hardware resource usage and/or maximum clock frequency. In other words, it is possible that hardware kernels (either from an IP library or designed by a user) can have streaming input/output ports described by the parameterised method. In embodiments, the parameterisation may include determination of one or more of:

Type of interface (PUSH vs PULL)
Width of interface
Clock rate of interface
Latency of flow control signals (e.g. stall/empty)

There is also provided, the automatic optimization of clock domain and aspect for streaming interconnect. Thus, clock domain and aspect (bitwidth) for intermediate kernels (especially simple kernels such as routing muxes and demuxes) may be selected. By appropriate selection of bitwidth and clock domains, hardware resources for 'glue logic' that moves data between clock domains and packs/unpacks data between different bitwidths is minimized. Glue logic may be thought of generally as logic that is purely concerned with the movement of data between kernels and between kernels and IO devices.

Thus, an optimization problem may be solved to yield a design with optimal resource usage without manual optimization effort. By such optimization, the design is able to fit on a smaller, cheaper device or leave more resource for other enhancements, without loss of performance or functionality.

As will be explained below, this is achieved, by allocating widths and clocks to intermediate kernels to minimize the "cost" of glue logic, i.e. the amount of hardware resources (e.g. FPGA resources) that need to be dedicated to the glue logic. The cost of glue logic for a single stream connection is dependent upon the bitwidth and whether the clock domains are the same. Transitioning data between different clock domains requires an asynchronous FIFO buffer with the same bitwidth as the streaming data, and transitioning data between different bitwidths requires packing/unpacking logic or a FIFO buffer with different sized read and write ports.

In addition, in embodiments, there is provided the automatic optimization of buffering to prevent deadlock and minimize hardware resource usage. As will be explained below, a method for specifying the buffering requirement of kernels is provided so that the location and quantity of buffers is optimized by an automatic tool. Each kernel has multiple input and output ports. A 'buffer space' constraint is associated with each port. Each port has a constraint that it either requires or provides N bytes of buffering (N can be zero). This provides the benefit of minimizing hardware resource spent on buffering to prevent deadlock without manual optimization effort.

"Requiring N bytes of buffering", mean the output/input needs to 'see' N bytes of buffering. For an output port, this means that the output can freely produce N bytes that will be stored in the buffer without a deadlock arising, irrespective of what other kernels in the design are doing. For an input port, this means that there can be up-to N bytes of data buffered at the input. Providing N bytes of buffering means that the kernel internally contains N bytes of buffering at the respective input/output which is independent of the other inputs/outputs. The designer of each kernel needs to specify the constraints for all inputs/outputs. The automated tool ensures that the sum of buffering (provided−required)>zero for all stream connections in the design.

Last, there is provided the automatic scheduling of interconnect blocks to minimize hardware resource usage.

Figure 8:
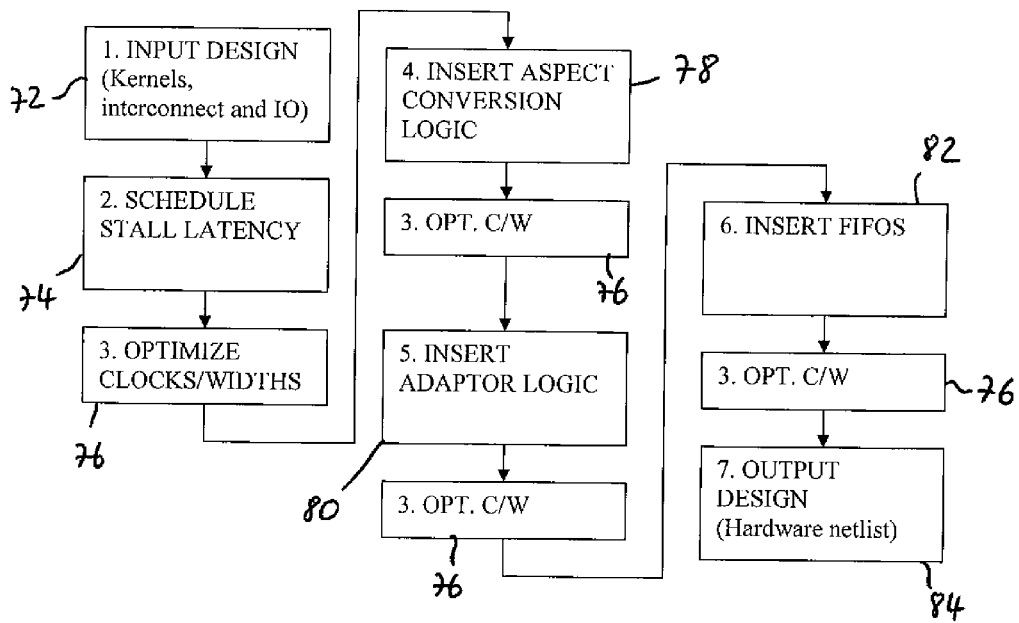
FIG. 8 is a flow diagram showing schematically a method of generating an optimized hardware design.

In more detail now, FIG. 8 is a flow diagram showing schematically a method of generating an optimized hardware design. The method may be embodied as a compiler in an appropriate language, e.g. Java. that executes an input design and generates a hardware design in the form of a netlist or other such means of representing a desired plane for a pipelined hardware design. The compiler may be provided as computer code stored on some form of reader or carrier. In one example the compiler is code stored on a disc or other such form of computer readable medium. The netlist may be for a sequence of components that are to be configured on a programmable hardware design such as a FPGA.

As can be seen with reference to FIG. 8, the compiler, at step 72, takes an input design (description of kernel interfaces and connectivity between kernels/IO) and, at step 84, generates an optimized hardware output design. The flow through the compiler is illustrated in the form of a block diagram with individual blocks representing stages of operation of the compiler. As will be explained below, the optimizations are implemented in several stages (numbered 2 to 6). In practice many of these optimizations could be combined into a single stage and individual optimizations can be omitted. Considering certain optimization stages at the same time could achieve better quality of results. Preferably, an implementation is determined that can represent a trade off that gives good results for practical designs and short compile times.

In a first stage 72, an input design is provided to the compiler. Next, at a second stage 74 the stall latency throughout the design is scheduled. At the next stage 76, clocks and data widths are then optimized for the design so far. At the next stage 78, aspect conversion logic is added to the design and then, again, clocks and data widths are optimized. Next, at stage 80, adaptor logic is added to the design and then any subsequent optimizations to clocks and data widths are made 76. Last, at stage 82 parts of the design, which despite all other optimization already performed have not been completed, are addressed by the addition, at stage 6, by the addition of FIFOs.

For a further time, the step 76 clocks and data widths are optimized and finally the design for the hardware is provided as an output. Thus, the step 76 of optimizing clocks and widths is preferably repeated after every other optimization that could add additional kernels to the design since any such newly-added kernels will have clocks and widths assigned to them. A design for the programmable logic is then generated at step 84. Thus, in an embodiment, the method provides for the automatic generation of an optimized FPGA design, achieved by a parameterisation of the process interconnects during the an FPGA design process.

Once the design is complete, it may then be implemented using known techniques of programming. For example, the appropriate programming may be applied to an FPGA so that a programmed device having the determined design is generated for use. Each of the stages mentioned above and shown in FIG. 8 will now be described in detail.

Input Design

The input 72 to the Manager Compiler is typically a user design comprising kernels and data streams between kernels. The user design is preferably represented as a directed graph with kernels as vertices of the graph and data streams as arcs between the vertices. The actual input design may be constructed in any known manner, such as via a Java software library. Preferably, the Manager Compiler converts a cyclic input graph into an acyclic graph to simplify the algorithms. This means that optimizations do not occur over cycles (which are relatively rare). Alternatively, more complex algorithms could operate directly on the cyclic input graph. A cyclic or circular graph is a graph that includes one or more cycles, i.e. some number of vertices connected in a closed chain. In contrast, an acyclic graph is one formed by a collection of vertices and directed edges, each edge connecting one vertex to another, such that there is no way to start at some vertex and follow a sequence of edges that eventually loops back to the starting vertex again.

As explained above, each kernel typically has multiple input/output ports and multiple 'width domains' and 'clock domains'. A width domain is a group of input/output ports with the same aspect (width). A clock domain is a group of input/output ports synchronous to the same clock. Both width and clock domains may be fixed (assigned to a fixed value), or floating (assignable to any value to suit the rest of the design).

Figure 9:
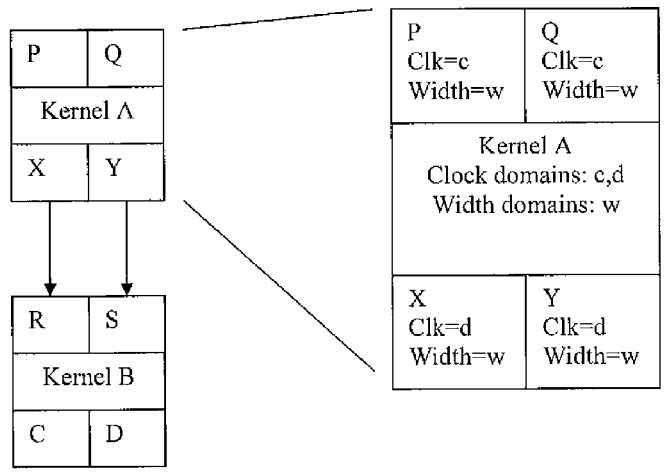
FIG. 9 is a schematic representation of a kernel having two clock domains and one width domain.

For example, with reference to FIG. 9, it can be seen that Kernel A has two clock domains (c and d) and one width domain (w). In this case, all the input/output ports have the same width, all inputs have the same clock and all outputs have the same clock.

Each input port (P, Q, R, S) and each output port (X, Y, C, D) also has a 'Flow control type'. The flow control type specifies the flow control used to manage data transfer (PUSH/PULL) and any parameterisation of that flow control (stall latency, almost empty latency).

In a case with PUSH flow control on inputs and outputs, the stall latency parameter on the output side can be expressed as the stall latency on the input side plus a constant K. Similar special cases (for PULL→PULL) could additionally be handled but this situation does not generally emerge in practice. The significance of constant K is to enable the scheduling of stall latency, as described below.

TABLE 1

Flow control types and signals [brackets] indicate optional signals

| Flow control type | PUSH | PULL |
|---|---|---|
| Signals (SOURCE->SINK) | VALID | EMPTY [ALMOST_EMPTY] |
| Signals (SINK->SOURCE) | STALL [STALL_HARD] | READ |
| Parameters | Stall latency (constant >=1 OR latency of another port + constant) | Almost empty latency (constant >=1) |

The flow control types are parameterised with a stall latency (PUSH) or an almost-empty latency (PULL). The stall latency is the number of cycles after STALL is asserted by the sink that the source can continue to assert VALID before data is lost. The almost-empty latency is the number of cycles the sink can assert READ after the source asserts ALMOST_EMPTY before the source is under-flowed. Input/output ports with identical flow control and parameterisation can be trivially connected together. For non-identical cases, there is sufficient information to connect the two interfaces, possibly with some glue logic or additional buffering, as explained below in greater detail.

The determination as to whether a port can be connected to another or not and what, if any, hardware needs to be added, is made based on the following rules:
1. PULL->PUSH requires trivial glue-logic
2. PUSH->PULL requires buffering
3. PULL->PULL requires buffering IF the almost_empty latency of the sink>that of the source.
4. PUSH->PUSH requires buffering IF the stall latency of the source>that of the sink.

Schedule Stall Latency

Figure 10:
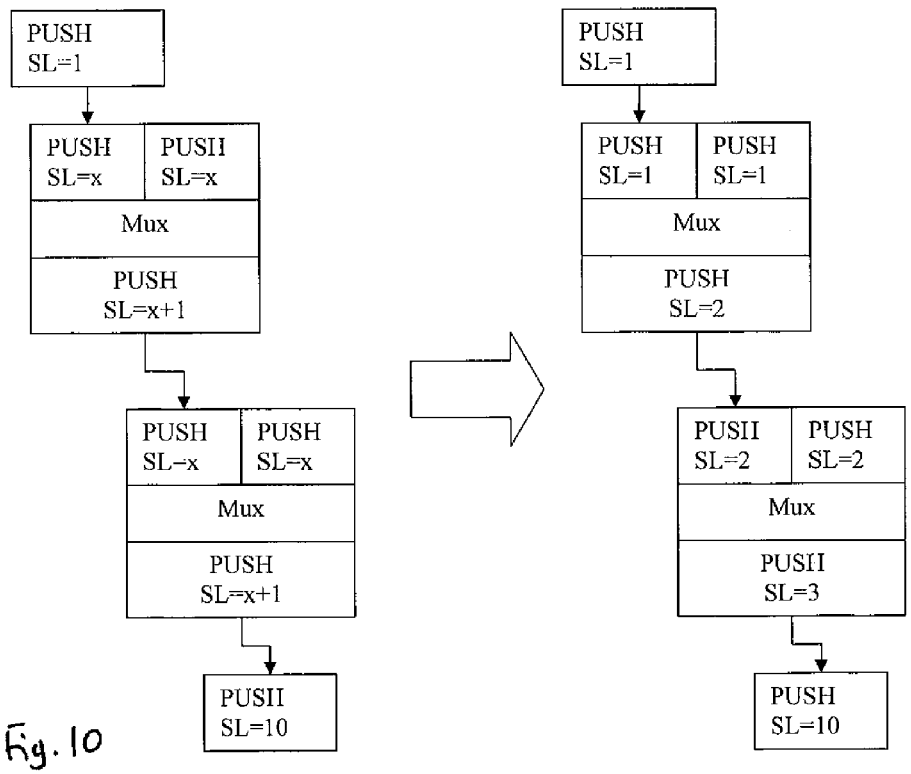
FIG. 10 is a schematic representation of a chain of mux kernels.

Next, at step 74, stall latency is scheduled. This operation serves to minimize buffering by scheduling the stall latency of kernels that have the common special case of PUSH inputs, and PUSH outputs. In the example of FIG. 10, a chain of mux kernels connect between a push source with stall latency (SL)=1 and a push sink with stall latency (SL)=10. A scheduling algorithm is used. In a preferred example an ASAP (as-soon-as-possible) scheduling algorithm is used but, in principle, any scheduling algorithm could be used. One example is Integer Linear Programming.

A specific example will now be described with reference to FIG. 10. As can be seen, in this example a chain of mux kernels is provided between a source and sink push interface. The stall latency (SL) on the output of each of the muxes is a function of that on the corresponding input. Buffering is required when going from a source with an SL greater than that of the corresponding sink SL. By appropriate selection of SL values it is possible to minimise or avoid buffering between the mux kernels. Without the step of scheduling stall latency, the stall latency on the inputs/outputs would be fixed (for example, SL=2 at the outputs and SL=1 at the inputs). In this case, buffering would needlessly be inserted between the two mux kernels, since there would be a path going from SL=2 at the source to SL=1 at the sink.

Referring again to FIG. 8, after the stall latency has been scheduled, at step 3, the clocks and data widths are optimized throughout the network.

Optimization of Clocks and Data Widths

The optimize clocks/widths step (step 3) intelligently assigns the clocks and bitwidths of kernels that do not have fixed clocks/widths to minimize resource usage on width/clock transition logic. A form of combinatorial optimization may be used to do this. In the present example, a dynamic programming type algorithm is used by which the complex problem of optimization is solved by breaking the complex problem down into simpler subproblems. Alternatively, many exact/approximate techniques could be used. One specific non-limiting example is given in detail below. The optimize clocks/widths step is repeated after every other optimization step that could add additional kernels to the design since these kernels need to have clocks/widths assigned to them.

In one example, the algorithm used is as follows:
1. Split the acyclic graph of processes into a number (forest) of trees. A tree is a subset of graph nodes (processes) where there is exactly one simple path between any two nodes. Hence, the use of an acyclic graph simplifies the splitting up of the network as a whole.
2. For each tree, an iteration is performed in post-order, i.e. leaves first, root last, over the nodes.
3. For each node, the set of all possible assignments of clock/width is computed. For example, if there are two possible clocks (CLK_A and CLK_B) and two possible widths (8, 16) the set of possible assignments is CLK_A: 8, CLK_B:8, CLK A:16, CLK_B:16.
4. For each assignment set, the minimum cost of the clock/width transition from each child node is calculated. The assignment cost is computed as the cost of the child node assignment plus the cost of transition from the child node assignment to the current assignment.

Figure 11:
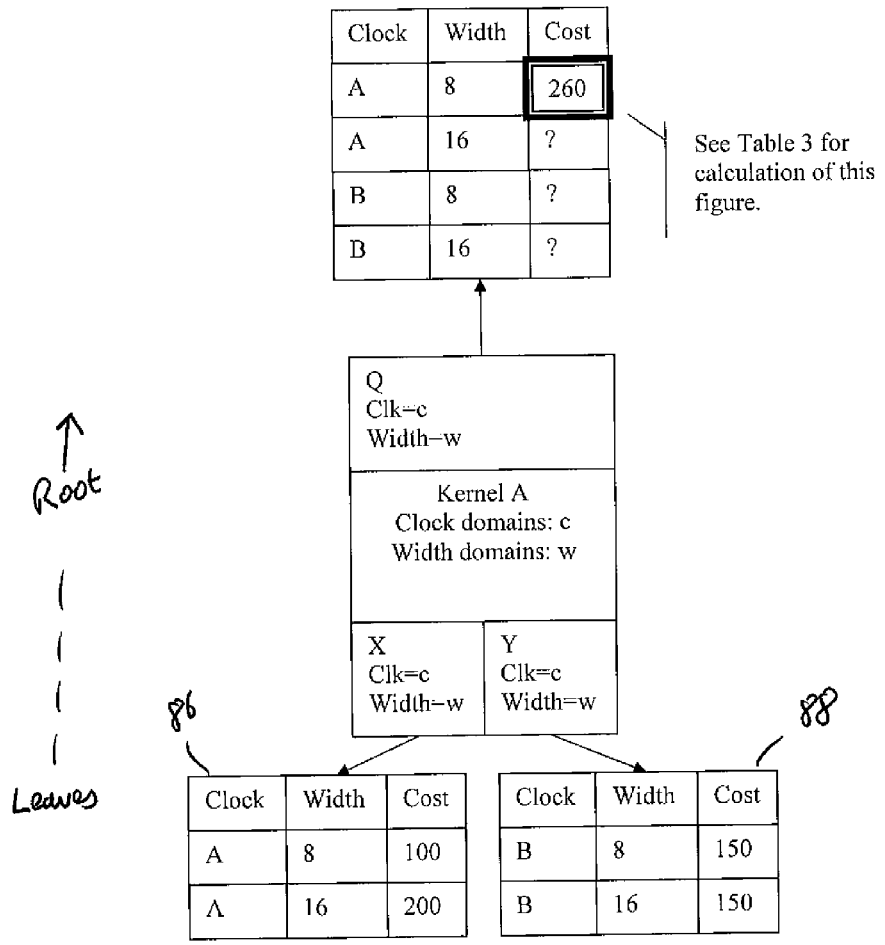
FIG. 11 is a schematic representation of the steps in optimization of clock and width for a kernel.

FIG. 11 shows a worked example of calculating the assignment costs in a simple tree consisting of one node (a tree node: Kernel A) with two children (X and Y) 86 and 88. Each child has a minimum cost associated with each possible assignment of clocks/widths. For the first child 86 the minimum cost for having clock A and width 8 is "100". The minimum cost for having clock A and width 16 is 200. For the second child 88, with Clock B, the cost is the same "150" irrespective of the assigned width (8 or 16). Thus, so far costs have been determined for assigning the widths and clocks to the respective children.

It is now determined what the costs are for transitioning between different data widths, given that the values for the kernel A are determined as a clock A and a width 8. This can be understood with reference to table 2 below, which shows the example costs for different transitions:

TABLE 2

| Source width | Destination width | Cost - no clock transition | Cost - with clock transition |
|---|---|---|---|
| 8 | 8 | 0 | 10 |
| 8 | 16 | 5 | 15 |
| 16 | 8 | 5 | 15 |
| 16 | 16 | 0 | 10 |

As can be seen, where there is no change in data width and no clock transition, the cost for this "transition" is zero (there would in fact be no glue logic required to transition the data). In each case where there is a change in data width (8 to 16 or 16 to 8) but there is no clock transition, the cost is "5". In each case where there is both a change in data width and a clock transition, the cost is 15.

Next, all the combinations of assignments for the child nodes are enumerated to find the values for the parameters of the various nodes which generate the minimum overall cost. The cost calculated in each row is the sum (for every child node) of the child node assignment cost+the transition cost to the particular assignment. Table 3 below shows this calculation with all combinations enumerated:

TABLE 3

| X Child | | | Y Child | | | Cost for Kernel A |
|---|---|---|---|---|---|---|
| Clock | Width | Cost | Clock | Width | Cost | Clock = A Width = 8 |
| A | 8 | 100 | B | 8 | 150 | 100 + 0 + 150 + 10 = 260 |
| A | 8 | 100 | B | 16 | 150 | 100 + 0 + 150 + 15 = 265 |
| A | 16 | 200 | B | 8 | 150 | 200 + 5 + 150 + 10 = 365 |
| A | 16 | 200 | B | 16 | 150 | 200 + 5 + 150 + 15 = 370 |

The figures in table 3 are the figures from the options shown in FIG. 11 with the costs from tables 2. Thus, for row 1, the cost for Kernel A having clock A and a width of 8, is made up of the cost with child X having clock A and width 8 (100), plus the cost with child Y having clock B and width 8 (150), plus the required transition costs (0+10). The total minimum cost is therefore 260 and the prescribed assignments are thus made. It can be seen that using this calculation it becomes apparent that any other assignments of clock or data widths to the Kernel A would have a higher overall cost. For example, if child X is assigned data width 16 and child Y is assigned data width 8, then the overall cost of the transitions would jump to 365, which would be a significant increase.

Figure 4:
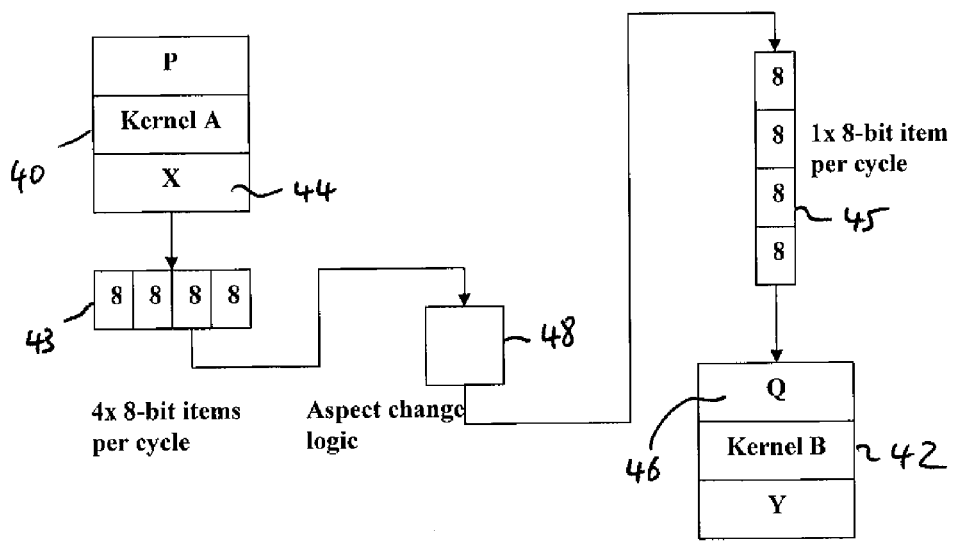
FIG. 4 is a schematic representation of a data flow path including 2 kernels (A and B) with different data widths.
Figure 5:
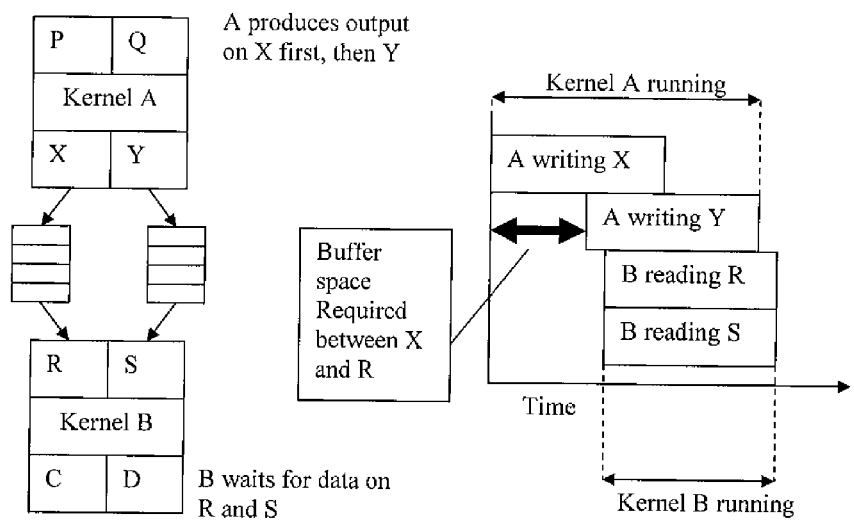
FIG. 5 is a schematic representation of 2 kernels (A and B) requiring buffering to prevent deadlock.
Figure 6:
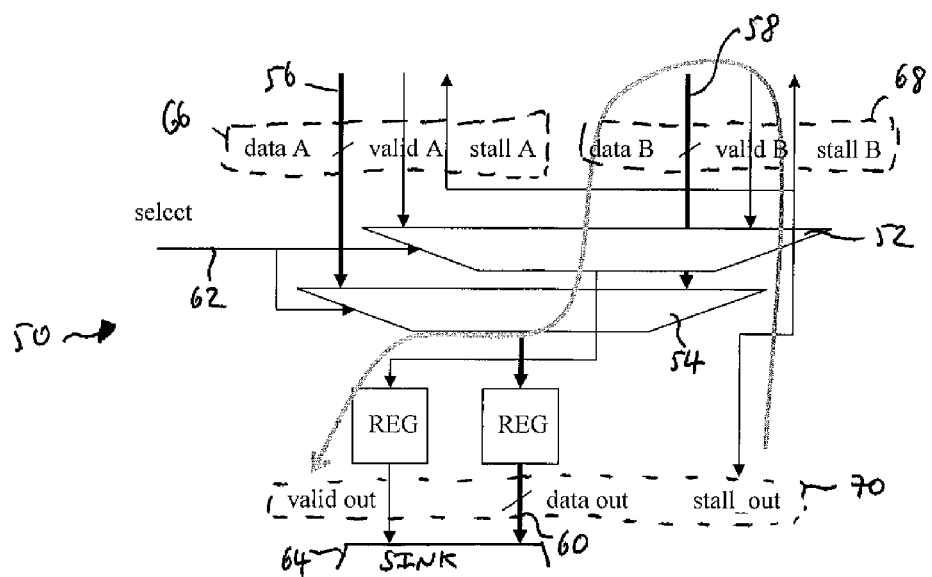
FIG. 6 is a schematic representation of a mux kernel that selects data from one of two input streams using stall/valid flow control.
Figure 7:
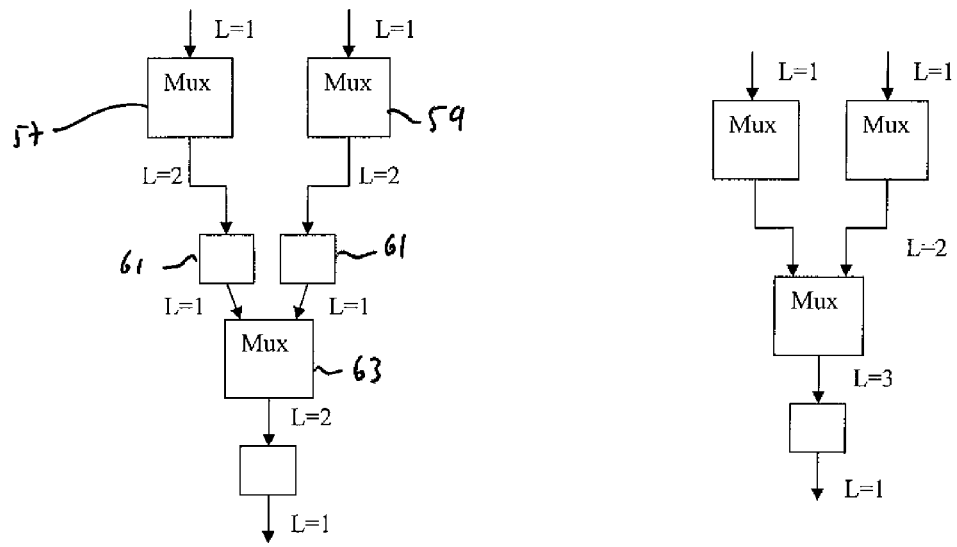
FIG. 7 is a schematic representation of a mux kernel that selects data from one of two input streams using stall/valid flow control.

Once an assignment has been made for Kernel A, Kernel A itself becomes a child node in the step of the calculation and so the values may be determined for the tree (and eventually, the network) as a whole. The method thus enables the assignment of such parameters to be made automatically and efficiently without loss of performance for the device as a whole.
Insertion of Aspect Conversion Logic Referring again to FIG. 8, once the data widths and clocks have been determined throughout the network, any required aspect conversion logic is inserted into the design at step 78. As shown in and described above with reference to FIG. 4, where there is some change in aspect, logic can be required to process received data at one aspect and provide it on an output at a second aspect. A shift register is a well-known example of aspect conversion logic that converts a narrow width N at the input of the register to a multiple of the width N*K at the output every K cycles.

Following the insertion of any required aspect conversion logic, the process of clock and width optimization is again performed for the newly inserted logic.
Insertion of Adaptor Logic Next, at step 80, adaptor logic is inserted. Adaptor logic is used to convert between different types of flow control types as explained above with reference to table 1. The adaptor logic takes the form of glue logic or additional buffering as would be required in dependence on each specific situation. Following the insertion of any required adaptor logic, the process of clock and width optimization is again performed for the newly inserted logic.
Insertion of FIFOs Next, at step 82, FIFOs are inserted. This stage is performed once all the kernels and the like have been parameterised to optimize latencies as described above, and the widths and clock have been allocated. It is only at this stage that any remaining problems with the design are addressed by the insertion of additional FIFO where it is required. Indeed, since it is desired to keep the additional hardware utilised to a minimum this stage is preferably performed only once the other stages of optimization have been performed.

Figure 12:
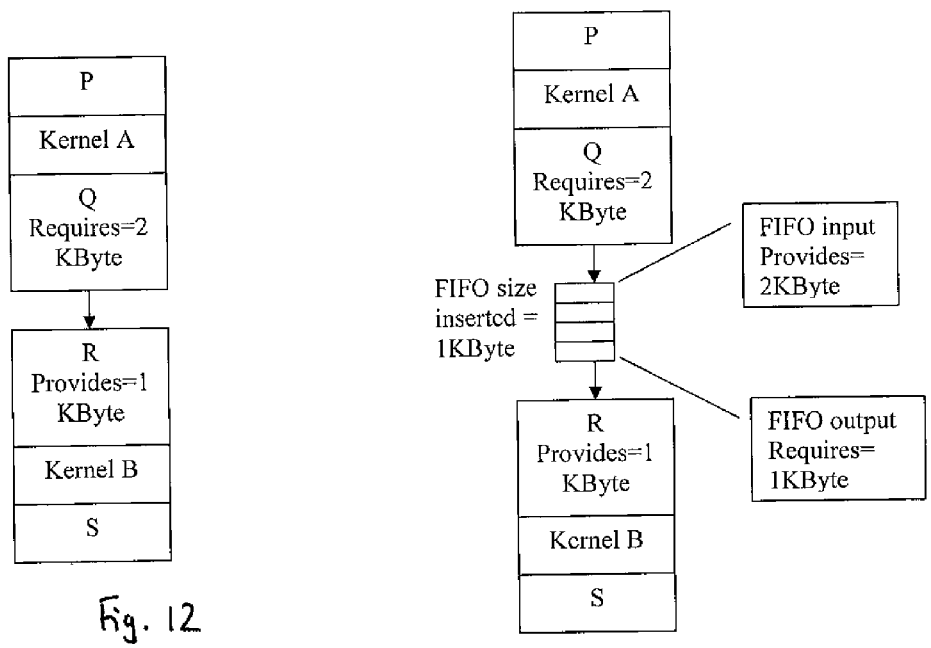
FIG. 12 shows schematically the process of optimized buffer insertion.

Referring to FIG. 12, a situation in which additional buffering may be required will now be described. As shown in the left hand image in FIG. 12, initially two kernels, Kernel A and Kernel B, are connected. The port Q of Kernel A requires 2 Kbytes of buffering, whereas the port R of Kernel B, to which port Q of Kernel A is connected provides only one Kbyte of buffering. Thus, it is determined that one additional Kbyte of buffering is required and so this insertion is made. The FIFO is selected so as to provide 2 Kbytes of storage whereas the FIFO output only needs 1 Kbyte. Thus, by the insertion of 1 Kbyte of FIFO the conflict between Kernels A and B is addressed.

Figure 13:
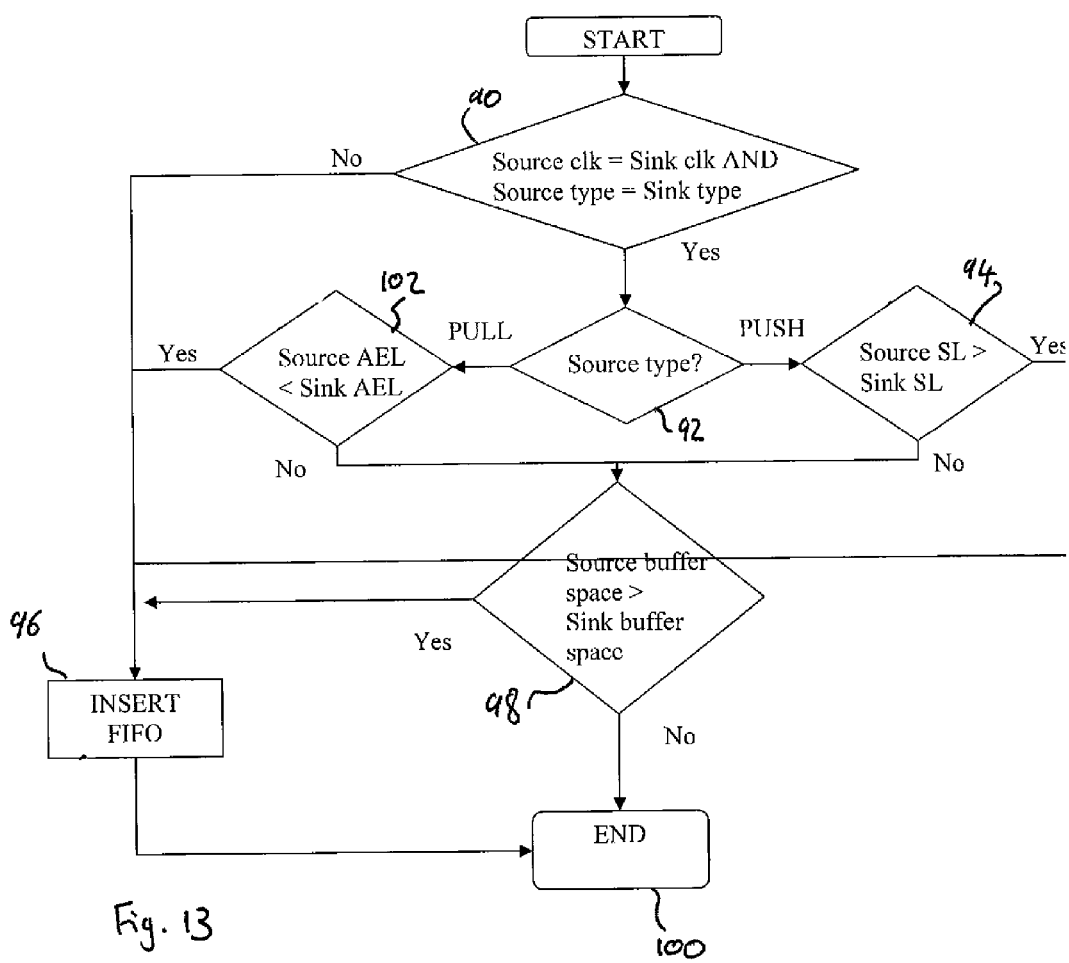
FIG. 13 a schematic representation of the steps in optimization of FIFO buffers.

With reference to FIG. 13, a schematic flow chart is shown to demonstrate the steps in the determination of required FIFOs between kernels. Initially, at step 90, a determination is made as to whether or not the clock and flow control type of port for each of the connected sink and source in question are the same. If they are, the method progresses to step 92, where the actual type of source is determined. If they are not, then a FIFO is inserted (step 96) into the design.

In the case of a PUSH type source, the method progresses to step 94 where it is determined if the stall latency (SL) of the source is greater than that of the connected sink. If it is, then a FIFO is inserted (step 96) into the design. If it is not, a determination is made as to whether or not the source buffer space is greater than that of the sink (step 98). If it is not, then the method is complete (step 100) and no additional FIFO is required. If it is, i.e. the source buffer space is greater than that of the sink, then a FIFO is inserted (step 96) into the design.

Back at step 92, where the source type is identified, if it is determined that the source is a PULL source, then, at step 102, a determination is made as to whether the source "Almost Empty latency" (AEL) is less than that of the connected sink. If it is, then a FIFO is inserted (step 96) into the design. If it is not, the method progresses to step 98 as described above at which a determination is made as to whether or not the source buffer space is greater than that of the sink. Thus, a simple but reliable mechanism is provided by which a determination can be made automatically as to whether or not additional FIFOs are required within a network of nodes as described herein.

Overall, it will be appreciated that in an embodiment, what is provided is a method and apparatus for performing an optimization of a complex system with plural variables and possible solutions. The method is arranged, upon receipt of an input designating processes to be performed by a desired processor, automatically to optimize parameters within a design so as to minimise hardware requirements to provide the specified functionality. Once the parameters have been determined, a design is generated in accordance with the optimization. Thus, the problems identified above with respect to latency, flow control and variable clock rates and data widths across processes, are addressed.

Embodiments of the invention have been described with particular reference to the examples illustrated. However, it will be appreciated that variations and modifications may be made to the examples described within the scope of the invention.

The invention claimed is:

1. A method of generating a processing engine design comprising plural stream processing kernels and having one or more dynamically managed first-in first-out (FIFO) data streams between the plural stream processing kernels to provide data paths between the plural stream processing kernels, the method comprising:
   upon receipt of an input design designating processes to be performed by the stream processor, automatically optimizing, by a processor, parameters associated with the dynamically managed FIFO data streams between stream processing kernels within the input design so as to minimize hardware requirements whilst providing the required functionality;
   generating, by the processor, an optimized output design in accordance with the optimization, including automatically determining flow control methodologies between stream processing kernels for use in the output design; and
   scheduling stall latencies between the stream processing kernels by using defined parameters.

2. The method according to claim 1, in which each of the stream processing kernels has one or more output ports connected to one or more input ports of a connected kernel and a corresponding clock rate, the method comprising optimizing the clock rates for connected ports.

3. The method according to claim 1, in which each of the stream processing kernels has one or more output ports connected to one or more input ports of a connected stream processing kernel and a corresponding data width, the method comprising automatically optimizing data widths for connected pairs of ports.

4. The method according to claim 1, in which the parameters are optimized using combinatorial optimization.

5. The method according to claim 4, in which the combinatorial optimization is performed using a dynamic programming algorithm.

6. The method according to claim 1, in which the input design is in the form of an acyclic graph in which stream processing kernels are vertices of the graph and data streams between stream processing kernels are arcs between the vertices, the method comprising performing the automatic optimization for a subtree of the graph and, preferably, once complete, for subsequent subtrees of the graph until the entire graph has been optimized.

7. The method according to claim 1, comprising utilizing numerical methods to determine optimum values for the data widths and clock rates of each stream processing kernel.

8. The method according to claim 7, comprising determining cost for each configuration of values within a kernel, and assigning to the stream processing kernel values that provide the minimum overall cost for the stream processing kernel.

9. The method according to claim 8, determining cost for transfer from one stream processing kernel to another, the overall cost being made up of the sum of cost for a configuration of values within a stream processing kernel and the cost for transfer from one stream processing kernel to another.

10. The method according to claim 8, comprising once the overall cost for a subtree, performing the optimization for subsequent subtrees of the graph until the entire graph has been optimized.

11. The method according to claim 1, comprising automatically providing aspect conversion logic in the design once optimization has been performed.

12. The method according to claim 1, comprising automatically providing adaptor logic in the design once optimization has been performed.

13. The method according to claim 1, comprising automatically inserting FIFOs into the design once optimization has been performed.

14. The method according to claim 1, comprising optimizing clock rates and data widths after each optimization step.

15. The method according to claim 13, in which FIFOs are only inserted between any pair of stream processing kernels if one or more conditions are satisfied, the conditions, including:
   the source clock rate and the sink clock rate are not the same; and
   the source flow control methodology and the flow control methodology are not the same.

16. A method of making a programmable logic device, comprising:
   generating a design using the method of claim 1; and
   programming the logic device to embody the generated design.

17. A non-transitory computer readable medium, containing instructions that, when run on a computer, executes the steps of claim 1.

18. A Field Programmable Gate Array or other programmable logic, having a design generated using method of claim 1.

19. A system for generating a hardware stream processor design, the system comprising:
   a processor arranged to execute the method of claim 1 and to generate a list of instructions for the programming of a programmable logic device having the generated design.

20. A method of generating a processing engine design comprising plural stream processing kernels and having one or more dynamically managed first-in first-out (FIFO) data streams between the plural stream processing kernels to provide data paths between the plural stream processing kernels, the method comprising:
   upon receipt of an input design designating processes to be performed by the stream processor, automatically optimizing, by a processor a parameters associated with the dynamically managed FIFO data streams between stream processing kernels within the input design so as to minimize hardware requirements whilst providing the required functionality;
   generating, by the processor, an optimized output design in accordance with the optimization, including automatically determining flow control methodologies between stream processing kernels for use in the output design; and
   in the event that the flow control methodologies between stream processing kernels in the output design are all of one specified type, defining a parameter to represent a stall latency between the stream processing kernels in a cascade of connected stream processing kernels and determining a value for the parameter so as to minimize storage requirements.

* * * * *